United States Patent
Mizoguchi et al.

(10) Patent No.: US 9,917,197 B2
(45) Date of Patent: Mar. 13, 2018

(54) THIN FILM ELEMENT, SEMICONDUCTOR DEVICE, AND METHOD FOR MANUFACTURING THE SAME

(71) Applicant: Semiconductor Energy Laboratory Co., Ltd., Atsugi-shi, Kanagawa-ken (JP)

(72) Inventors: Takafumi Mizoguchi, Atsugi (JP); Kojiro Shiraishi, Isehara (JP); Masashi Tsubuku, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/219,764

(22) Filed: Jul. 26, 2016

(65) Prior Publication Data

US 2016/0336459 A1 Nov. 17, 2016

Related U.S. Application Data

(62) Division of application No. 13/237,191, filed on Sep. 20, 2011, now Pat. No. 9,437,743.

(30) Foreign Application Priority Data

Oct. 7, 2010 (JP) .................................. 2010-227623

(51) Int. Cl.
*H01L 29/10* (2006.01)
*H01L 29/786* (2006.01)
(Continued)

(52) U.S. Cl.
CPC .... *H01L 29/78606* (2013.01); *H01L 27/1225* (2013.01); *H01L 27/1288* (2013.01);
(Continued)

(58) Field of Classification Search
CPC ....................... H01L 27/1225; H01L 27/1288; H01L 21/764
(Continued)

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1632999 A  3/2006
EP  1737044 A  12/2006
(Continued)

OTHER PUBLICATIONS

Kim.S et al., "High-Performance oxide thin film transistors passivated by various gas plasmas", 214th ECS Meeting, 2008, No. 2317, ECS.
(Continued)

*Primary Examiner* — Matthew E Warren
(74) *Attorney, Agent, or Firm* — Robinson Intellectual Property Law Office; Eric J. Robinson

(57) ABSTRACT

An object is to provide a method for manufacturing a semiconductor device without exposing a specific layer to moisture or the like at all. A thin film element is manufactured in such a manner that a first film, a second film, and a third film are stacked in this order; a resist mask is formed over the third film; a mask layer is formed by etching the third film with the use of the resist mask; the resist mask is removed; a second layer and a first layer are formed by performing dry etching on the second film and the first film with the use of the mask layer; a fourth film is formed to cover at least the second layer and the first layer; and sidewall layers are formed to cover at least the entire side surfaces of the first layer by performing etch back on the fourth film.

14 Claims, 12 Drawing Sheets

(51) Int. Cl.
*H01L 27/12* (2006.01)
*H01L 29/24* (2006.01)
*H01L 21/764* (2006.01)

(52) U.S. Cl.
CPC .......... *H01L 29/24* (2013.01); *H01L 29/7869* (2013.01); *H01L 29/78696* (2013.01); *H01L 21/764* (2013.01)

(58) Field of Classification Search
USPC .......................................................... 257/43
See application file for complete search history.

(56) References Cited

U.S. PATENT DOCUMENTS

| | | | |
|---|---|---|---|
| 6,143,640 | A | 11/2000 | Cronin et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,815,272 | B2 | 11/2004 | Oda et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,101,740 | B2 | 9/2006 | Young |
| 7,105,868 | B2 | 9/2006 | Nause et al. |
| 7,163,850 | B2 | 1/2007 | Oda et al. |
| 7,211,825 | B2 | 5/2007 | Shih et al |
| 7,215,388 | B2 | 5/2007 | Fukuhara |
| 7,253,494 | B2 | 8/2007 | Mino et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,749,820 | B2 | 7/2010 | Miyairi |
| 7,993,991 | B2 | 8/2011 | Miyairi et al. |
| 7,994,500 | B2 | 8/2011 | Kim et al. |
| 8,058,645 | B2 | 11/2011 | Jeong et al. |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 8,207,026 | B2 | 6/2012 | Suzawa et al. |
| 8,502,216 | B2 | 8/2013 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0042809 | A1 | 2/2005 | Oda et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0212296 | A1 | 8/2009 | Mizoguchi et al. |
| 2009/0224249 | A1 | 9/2009 | Miyairi et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0133530 | A1* | 6/2010 | Akimoto ........... H01L 21/02554 257/43 |
| 2010/0163862 | A1 | 7/2010 | Yang et al. |
| 2010/0176381 | A1 | 7/2010 | Yagi et al. |
| 2010/0187535 | A1 | 7/2010 | Suzawa et al. |
| 2010/0193772 | A1 | 8/2010 | Morosawa et al. |
| 2010/0193784 | A1 | 8/2010 | Morosawa et al. |
| 2010/0230683 | A1 | 9/2010 | Miyairi |
| 2010/0320458 | A1 | 12/2010 | Umeda et al. |
| 2010/0320459 | A1 | 12/2010 | Umeda et al. |
| 2011/0193083 | A1 | 8/2011 | Kim et al. |
| 2011/0215328 | A1 | 9/2011 | Morosawa et al. |
| 2012/0094433 | A1 | 4/2012 | Mizoguchi et al. |
| 2012/0119205 | A1 | 5/2012 | Taniguchi et al. |
| 2013/0299824 | A1 | 11/2013 | Akimoto et al. |
| 2014/0087517 | A1 | 3/2014 | Akimoto et al. |

FOREIGN PATENT DOCUMENTS

| | | |
|---|---|---|
| EP | 2226847 A | 9/2010 |
| EP | 2264770 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 07-273333 A | 10/1995 |
| JP | 08-264794 A | 10/1996 |
| JP | 09-121056 A | 5/1997 |
| JP | 10-303412 A | 11/1998 |
| JP | 11-505377 | 5/1999 |
| JP | 2000-022158 A | 1/2000 |
| JP | 2000-044236 A | 2/2000 |
| JP | 2000-150900 A | 5/2000 |
| JP | 2001-313396 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-320011 A | 11/2004 |
| JP | 2005-055660 A | 3/2005 |
| JP | 2005-057035 A | 3/2005 |
| JP | 2006-100760 A | 4/2006 |
| JP | 2006-339556 A | 12/2006 |
| JP | 2008-112909 A | 5/2008 |
| JP | 2009-158941 A | 7/2009 |
| JP | 2009-231613 A | 10/2009 |
| JP | 2009-239272 A | 10/2009 |
| JP | 2009-239276 A | 10/2009 |
| JP | 2010-016347 A | 1/2010 |
| JP | 4415062 | 2/2010 |
| JP | 2010-067954 A | 3/2010 |
| JP | 2010-135770 A | 6/2010 |
| JP | 2010-177431 A | 8/2010 |
| JP | 2010-182818 A | 8/2010 |
| JP | 2010-182819 A | 8/2010 |
| JP | 2010-199570 A | 9/2010 |
| JP | 4571221 | 10/2010 |
| JP | 2012-160679 A | 8/2012 |
| TW | 594103 | 6/2004 |
| TW | I293209 | 2/2008 |
| TW | I366273 | 6/2012 |
| WO | WO-2003/094244 | 11/2003 |
| WO | WO-2004/114391 | 12/2004 |
| WO | WO-2006/025609 | 3/2006 |
| WO | WO-2008/133345 | 11/2008 |
| WO | WO-2009/072451 | 6/2009 |
| WO | WO-2010/053060 | 5/2010 |

OTHER PUBLICATIONS

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Janotti.A et at., "Oxygen Vacancies In ZnO", Appl. Phys. Lett. (Applied Physics Letters), 2005, vol. 87, pp. 122102-1-122102-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Lee.H et al., "Current Status of, Challenges to, and Perspective View of AM-OLED ", IDW '06 : Proceedings of the 13th International Display Workshops, Dec. 7, 2006, pp. 663-666.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Mo.Y et al., "Amorphous Oxide TFT Backplanes for Large Size AMOLED Displays", IDW '08 : Proceedings of the 6th International Display Workshops, Dec. 3, 2008, pp. 581-584.

Sakata.J et at., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Park.J et al., "High performance amorphous oxide thin film transistors with self-aligned top-gate structure", IEDM 09: Technical Digest of International Electron Devices Meeting, Dec. 7, 2009, pp. 191-194.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Parks et al., "Challenge to Future Displays: Transparent AM-OLED Driven by PEALD Grown ZnO TFT", IMID '07 Digest, 2007, pp. 1249-1252.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, H1009-H1014.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Kimizuka.N et al., "Spinel,YbFe2O4, and Yb2Fe3O7 Types of Structures for Compounds in the In2O3 and Sc2O3—A2O3—BO Systems [A: Fe, Ga, or Al; B: Mg, Mn, Fe, Ni, Cu, or Zn] at Temperatures over 1000° C.", Journal of Solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kurokawa.Y et al., "UHF RFCPUS on Flexible and Glass Substrates for Secure RFID Systems", Journal of Solid-State Circuits, 2008, vol. 43, No. 1, pp. 292-299.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Kitzerow.H et al., "Observation of Blue Phases in Chiral Networks", Liquid Crystals, 1993, vol. 14, No. 3, pp. 911-916.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Kikuchi.H et al., "Polymer-Stabilized Liquid Crystal Blue Phases", Nature Materials, Sep. 2, 2002, vol. 1, pp. 64-68.
Nakamura.M, "Synthesis of Homologous Compound with New Long-Period Structure", NIRIM Newsletter, Mar. 1, 1995, vol. 150, pp. 1-4.
Orita.M et al., "Amorphous transparent conductive oxide InGaO3(ZnO)m (m<4):a Zn4s conductor", Philosophical Magazine, 2001, vol. 81, No. 5, pp. 501-515.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Janotti.A et al., "Native Point Defects in ZnO", Phys. Rev. B (Physical Review. B), Oct. 4, 2007, vol. 76, No. 16, pp. 165202-1-165202-22.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Miyasaka.M, "SUFTLA Flexible Microelectronics on Their Way to Business", SID Digest '07 : SID International Symposium Digest of Technical Papers, 2007, vol. 38, pp. 1673-1676.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Kikuchi,H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Clark.S et al., "First Principles Methods Using CASTEP", Zeitschrift fur Kristallographie, 2005, vol. 220, pp. 567-570.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Taiwanese Office Action (Application No. 100133778) dated Nov. 23, 2015.

\* cited by examiner

THIN FILM ELEMENT, SEMICONDUCTOR DEVICE, AND METHOD FOR MANUFACTURING THE SAME

BACKGROUND OF THE INVENTION

1. Field of the Invention

The present invention relates to a thin film element and a manufacturing method thereof. Further, the present invention relates to a semiconductor device and a manufacturing method thereof. Note that in this specification, a semiconductor device refers to a semiconductor element itself or a device including a semiconductor element. As an example of such a semiconductor element, for example, a transistor (a thin film transistor and the like) can be given. In addition, a semiconductor device also refers to a display device such as a liquid crystal display device.

2. Description of the Related Art

In recent years, semiconductor devices are indispensable to human life. Semiconductor elements, such as thin film transistors, included in semiconductor devices are manufactured in such a manner that a thin film such as a semiconductor film is formed over a substrate and the thin film is processed into a desired shape by a photolithography method or the like. Such a manufacturing method is used for forming a liquid crystal display device (e.g., a liquid crystal television).

As a material for a semiconductor layer provided for a thin film transistor, silicon is widely used. In recent years, a thin film transistor including an oxide semiconductor as a material for a semiconductor layer has been actively researched.

It is known that carrier concentration is greatly changed in a thin film transistor including an oxide semiconductor when moisture enters the semiconductor layer (e.g., Patent Document 1 and Patent Document 2). It is also known that characteristics of a thin film transistor including a semiconductor other than an oxide semiconductor are changed when moisture enters the semiconductor layer (e.g., Patent Document 3).

REFERENCE

Patent Document

[Patent Document 1] Japanese Published Patent Application No. 2010-182818
[Patent Document 2] Japanese Published Patent Application No. 2010-182819
[Patent Document 3] Japanese Published Patent Application No. 2005-055660

SUMMARY OF THE INVENTION

Once moisture enters a semiconductor layer, it is not easy to remove the moisture. Heat treatment performed on a semiconductor layer which moisture has entered can be given as an example of a means for removing the moisture. However, in the case where a semiconductor layer is provided over a glass substrate, for example, the upper heating temperature is limited and it takes long time to complete the heat treatment, causing a decrease in throughput.

A resist mask which is indispensable for processing a semiconductor layer can be removed by a dry process using oxygen plasma, in which the use of a stripper solution including water can be avoided. However, in the dry process, part of the resist mask readily remains.

One embodiment of the present invention aims to provide a method for manufacturing a semiconductor device, in which a surface of a semiconductor layer is not exposed to moisture or the like at all even when a resist mask is removed using a chemical solution including water. In particular, an object is to provide a manufacturing method in which a semiconductor layer is not exposed to a stripper including water for removing a resist mask.

Note that one embodiment of the present invention is not limited to a semiconductor device and a manufacturing method thereof, and may be applied to a thin film element other than a semiconductor device. A thin film element is mounted as a component or the like of a precision equipment, and it is needless to say that moisture and the like entering a component of a precision equipment might cause malfunction of the component.

One embodiment of the present invention is a method for manufacturing a thin film element, including the steps of: stacking a first film, a second film, and a third film in this order; forming a resist mask over the third film; forming a mask layer by etching the third film with the use of the resist mask; removing the resist mask using a chemical solution; forming a second layer and a first layer by performing dry etching on the second film and the first film with the use of the mask layer; forming a fourth film so as to cover at least the second layer and the first layer; and forming a sidewall layer so as to cover at least the entire side surface of the first layer by performing etch-back treatment on the fourth film. In this method, a thin film element can be manufactured without exposing the first layer to moisture or the like.

Note that in this specification, a film is to be processed in a later step and is roughly uniformly formed over a surface. A layer is the film which is processed or is the aforementioned film which does not need to be processed in a later step.

Note that in this specification, etch-back treatment refers to an etching process in which a film formed over a surface is subjected to highly anisotropic etching (e.g., dry etching) until part of the surface over which the film is formed is exposed.

A semiconductor element, a transistor, or the like can be given as an example of such a thin film element. As a transistor, a pixel transistor can be given as an example.

According to one embodiment of the present invention, a thin film element can be manufacture without exposing a surface of a specific layer to moisture or the like at all. Therefore, a semiconductor element such as a transistor can be manufactured without exposing a surface of a semiconductor layer to moisture or the like at all.

According to one embodiment of the present invention, a thin film element can be manufactured without a resist remaining and exposing a surface of a specific layer to moisture at all. Therefore, a semiconductor element can be manufactured without exposing a surface of a semiconductor layer to moisture at all.

BRIEF DESCRIPTION OF THE DRAWINGS

In the accompanying drawings.

DETAILED DESCRIPTION OF THE INVENTION

Figure 1A:
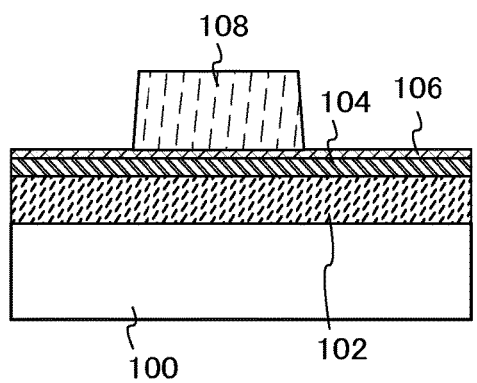
FIGS. 1A to 1F are cross-sectional views illustrating a method for manufacturing a thin film element according to one embodiment of the present invention.

Hereinafter, embodiments of the present invention will be described in detail with reference to the accompanying drawings. However, the present invention is not limited to the following description and it is easily understood by those skilled in the art that the modes and details can be variously changed without departing from the scope and spirit of the present invention. Accordingly, the present invention should not be construed as being limited to the description of the embodiments below.

Embodiment 1

In this embodiment, a method for manufacturing a thin film element according to one embodiment of the present invention will be described.

A method for manufacturing a thin film element, which is described in this embodiment, includes the steps of: stacking a first film 102, a second film 104, and a third film 106 in this order over a substrate 100; forming a resist mask 108 over the third film 106; forming a mask layer 110 by etching the third film 106 with the use of the resist mask 108; removing the resist mask 108; forming a second layer 112 and a first layer 114 by performing dry etching on the second film 104 and the first film 102 with the use of the mask layer 110; forming a fourth film 116 so as to cover the second layer 112 and the first layer 114; and forming sidewall layers 118 so as to cover at least the entire side surfaces of the first layer 114 by performing etch-back treatment on the fourth film 116. The method for manufacturing the thin film element of this embodiment will be described with reference to FIGS. 1A to 1F.

First, the first film 102, the second film 104, and the third film 106 are stacked over the substrate 100 in this order, and the resist mask 108 is formed over the third film 106 (FIG. 1A).

As the substrate 100, a glass substrate, a quartz substrate, a silicon substrate, a stainless steel substrate, a plastic substrate, or the like can be used. A material of the substrate is not particularly limited.

The first film 102 is a thin film whose characteristics are affected by entry of moisture. The first film 102 can be formed by a CVD method (including a plasma CVD method, a thermal CVD method, and the like), a sputtering method, or the like. Without limitation thereto, any means by which a thin film can be formed can be applied.

The second film 104 may be a film which can prevent the first film 102 from being exposed to moisture. Accordingly, the second film 104 is preferably a dense film. The second film 104 can be formed by a CVD method (including a plasma CVD method, a thermal CVD method, and the like), a sputtering method, or the like. Without limitation thereto, any means by which a thin film can be formed can be applied.

The third film 106 may be any film which can form the mask layer 110 in a later etching process. The third film 106 can be formed by a CVD method (including a plasma CVD method, a thermal CVD method, and the like), a sputtering method, or the like. Without limitation thereto, any means by which a thin film can be formed can be applied.

Figure 1D:
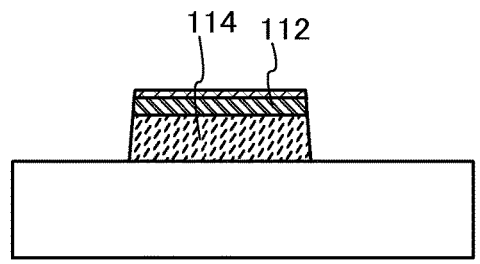
Figure 1B:
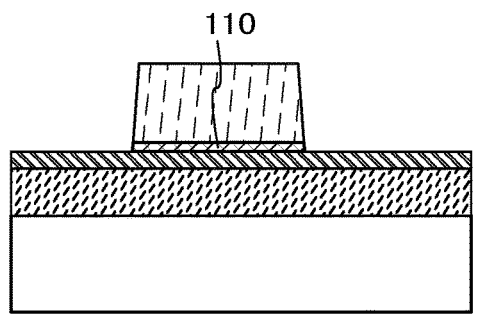

Next, the third film 106 is etched with the use of the resist mask 108 to form the mask layer 110 (FIG. 1B). In this embodiment, this process is referred to as a first etching process.

The resist mask 108 is formed in such a manner that a resist material is applied or the like over the third film 106 and then processed by a photolithography method.

The first etching process may be performed under such conditions that the etching rate of the third film 106 is high and the etching rate of the second film 104 is low. In other words, the first etching process is performed under such conditions that the etching selectivity of the third film 106 with respect to the second film 104 is high.

Figure 1E:
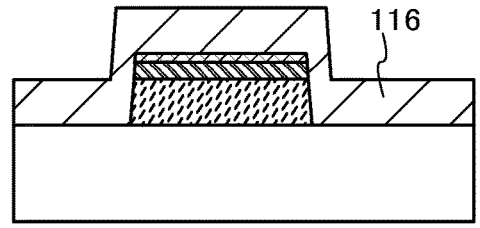
Figure 1C:
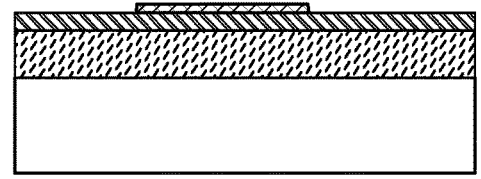

The resist mask 108 is removed by a chemical solution (FIG. 1C). Here, any chemical solution such as a resist stripper can be used as long as the resist mask 108 can be selectively removed. After that, components of the chemical solution are preferably removed by performing a cleaning process.

Alternatively, the resist mask 108 may be removed by a means other than a chemical solution (e.g., oxygen plasma ashing or water plasma ashing) and then a cleaning process may be performed. At this time, the resist mask 108 may be removed in such a manner that a plurality of treatments by the means is performed and then a cleaning process is performed; alternatively, the resist mask 108 may be removed in such a manner that treatment by the means is performed, a cleaning process is performed, and then treatment by the means is further performed.

Next, the second film 104 and the first film 102 are subjected to dry etching with the use of the mask layer 110 to form the second layer 112 and the first layer 114 (FIG. 1D). In this embodiment, this process is referred to as a second etching process.

The second etching process may be performed under such conditions that the etching rate of the third film 106 is low and the etching rates of the first film 102 and the second film 104 are high. In other words, the second etching process is performed under such conditions that the etching selectivity of the first film 102 and the second film 104 with respect to the third film 106 is high.

Note that the second etching process may include a plurality of etching steps. In the case where the second etching process includes a plurality of etching steps, it is preferable that etching be performed under such conditions that the etching rate of the second film 104 is higher than the etching rate of the first film 102, and then etching be performed under such conditions that the etching rate of the first film 102 is higher than the etching rate of the second film 104.

Next, the fourth film 116 is formed so as to cover at least the second layer 112 and the first layer 114 (FIG. 1E).

The fourth film 116 may be any film on which etch-back treatment can be performed in a later step. The fourth film 116 can be formed by a CVD method (including a plasma CVD method, a thermal CVD method, and the like), a sputtering method, or the like. Without limitation thereto, any means by which a thin film can be formed can be applied.

Figure 1F:
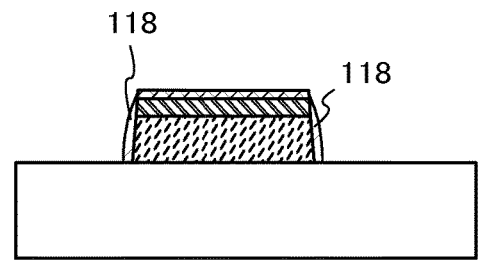

Next, the fourth film 116 is subjected to etch-back treatment to form the sidewall layers 118 so as to cover at least the entire side surfaces of the first layer 114 (FIG. 1F). In this embodiment, this process is referred to as a third etching process.

Note that here, etch-back treatment means etching treatment in which a thin film can be isotropically etched in a film thickness direction without forming a mask or the like over the thin film.

As described in this embodiment, the thin film element can be manufactured without exposing a surface of the first layer 114 to moisture or the like at all.

Embodiment 2

In the method for manufacturing a thin film element described in Embodiment 1, the mask layer 110 is left over the second layer 112; however, without limitation thereto, the mask layer 110 may be removed. A method for manufacturing a thin film element of this embodiment will be described with reference to FIGS. 1A to 1C, FIGS. 2A to 2D, and FIGS. 3A to 3C.

Figure 2A:
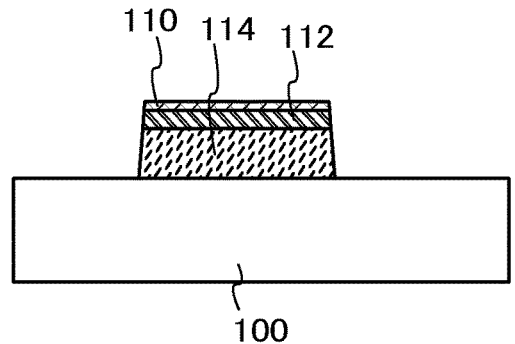
FIGS. 2A to 2D are cross-sectional views illustrating a method for manufacturing a thin film element according to one embodiment of the present invention.
Figure 2B:
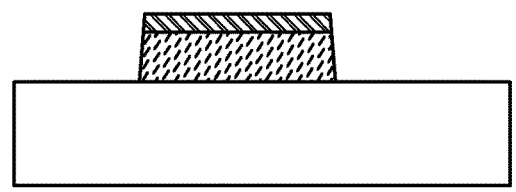
Figure 2C:
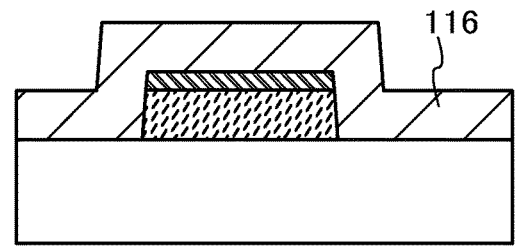
Figure 2D:
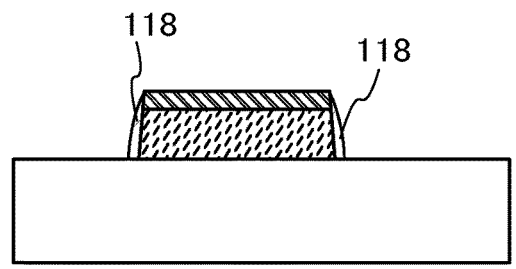

A method for manufacturing a thin film element, which is described in this embodiment, includes the steps of: stacking the first film 102, the second film 104, and the third film 106 in this order over the substrate 100; forming the resist mask 108 over the third film 106 (FIG. 1A); forming the mask layer 110 by etching the third film 106 with the use of the resist mask 108 (FIG. 1B); removing the resist mask 108 (FIG. 1C); forming the second layer 112 and the first layer 114 by performing dry etching on the second film 104 and the first film 102 with the use of the mask layer 110 (FIG. 2A); removing the mask layer 110 (FIG. 2B); forming the fourth film 116 so as to cover the second layer 112 and the first layer 114 (FIG. 2C); and forming the sidewall layers 118 so as to cover at least the entire side surfaces of the first layer 114 by performing etch-back treatment on the fourth film 116 (FIG. 2D).

A means by which the first layer 114 is not exposed to moisture (e.g., dry etching treatment) is applied to removal of the mask layer 110.

Figure 3A:
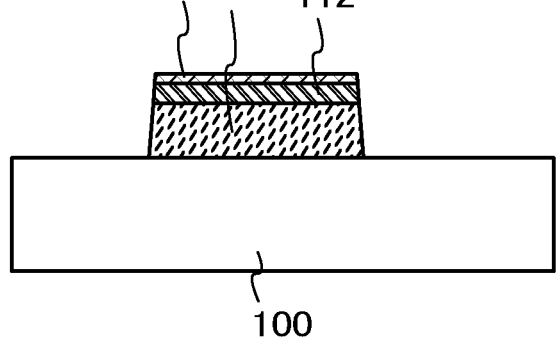
FIGS. 3A to 3C are cross-sectional views illustrating a method for manufacturing a thin film element according to one embodiment of the present invention.
Figure 3B:
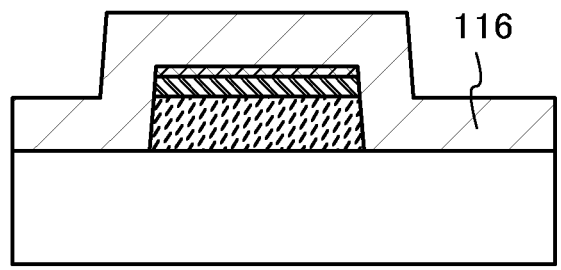
Figure 3C:
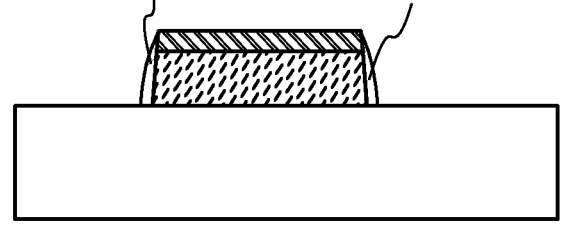

Alternatively, the fourth film 116 may be formed before removing the mask layer 110 and then the mask layer 110 may be removed by etch-back treatment. Accordingly, another method for manufacturing a thin film element, which is described in this embodiment, includes the steps of: stacking the first film 102, the second film 104, and the third film 106 in this order over the substrate 100; forming the resist mask 108 over the third film 106 (FIG. 1A); forming the mask layer 110 by etching the third film 106 with the use of the resist mask 108 (FIG. 1B); removing the resist mask 108 (FIG. 1C); forming the second layer 112 and the first layer 114 by performing dry etching on the second film 104 and the first film 102 with the use of the mask layer 110 (FIG. 3A); forming the fourth film 116 so as to cover the second layer 112 and the first layer 114 (FIG. 3B); and forming the sidewall layers 118 so as to cover at least the entire side surfaces of the first layer 114 and removing the mask layer 110 by performing etch-back treatment on the fourth film 116 and the mask layer 110 (FIG. 3C).

As described in this embodiment, as in Embodiment 1, the thin film element can be manufactured without exposing the surface of the first layer 114 to moisture or the like at all.

Embodiment 3

Figure 4A:
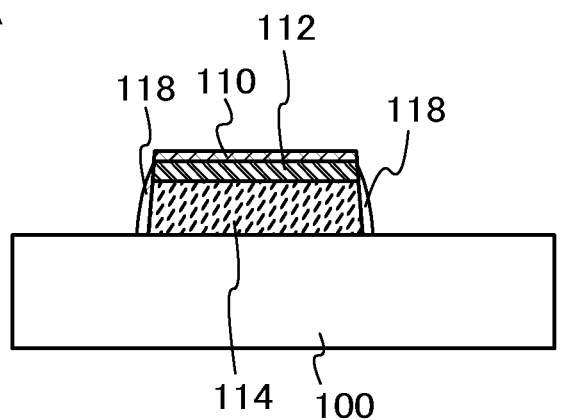
FIGS. 4A to 4C are cross-sectional views illustrating a method for manufacturing a thin film element according to one embodiment of the present invention.
Figure 4B:
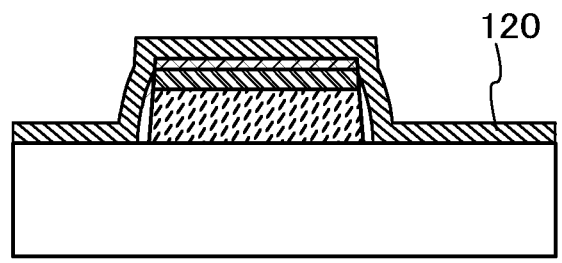
Figure 4C:
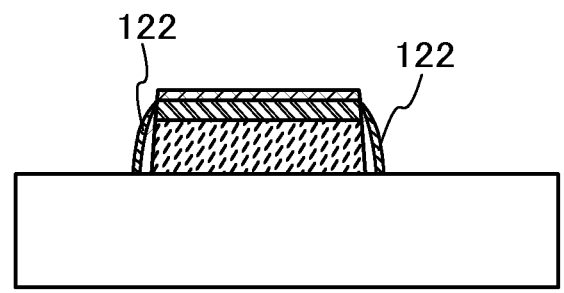

In the methods for manufacturing thin film elements described in Embodiment 1 and Embodiment 2, the sidewall layers are single layers; however, without limitation thereto, the sidewall layers may have a stacked structure in which a plurality of layers are stacked. In this embodiment, a mode in which the sidewall layers have a stacked structure will be described with reference to FIGS. 4A to 4C.

In the case where the sidewall layers have a stacked structure including two layers, the sidewall layers 118 are formed so as to cover at least the entire side surfaces of the first layer 114, a fifth film 120 is formed over the sidewall layers 118 and the mask layer 110, and the fifth film 120 is subjected to etch-back treatment to form additional sidewall layers 122. Note that the fifth film 120 may be formed after the sidewall layers 118 are formed and the mask layer 110 is removed.

In the case where the sidewall layers have a stacked structure including two layers, hydrogen, as well as moisture, contained in the first layer 114 can be reduced. For example, the fourth film 116 is formed by a sputtering method in an atmosphere from which moisture and hydrogen are removed as much as possible (see FIG. 1E, FIG. 2C, or FIG. 3B), and the fifth film 120 is formed by a CVD method (including a plasma CVD method, a thermal CVD method, and the like); thus, inside portions which are in contact with the first layer 114 can be formed in an atmosphere from which moisture and hydrogen are removed as much as possible, and outside portions can be a dense film that moisture and hydrogen hardly enter.

As described in this embodiment, as in Embodiment 1 and Embodiment 2, the thin film element can be manufactured without exposing the surface of the first layer 114 to moisture or the like at all, resulting in the first layer 114 with a reduced content of hydrogen. In addition, the sidewall layers having high barrier properties, which prevents hydrogen and moisture from entering the first layer 114, can be formed.

Embodiment 4

In this embodiment, a method for manufacturing a semiconductor element according to one embodiment of the present invention will be described. In this embodiment, although a transistor is given as an example of a semiconductor element, a semiconductor element is not limited to a transistor.

A method for manufacturing a transistor described in this embodiment includes the steps of: stacking a semiconductor film 210, a conductive film 212, and a mask film 214 in this order over a gate insulating layer 208 provided so as to cover a gate electrode layer 206; forming a first resist mask 216 over the mask film 214; forming a first mask layer 218 by performing dry etching or wet etching on the mask film 214 with the use of the first resist mask 216; removing the first resist mask 216; forming a conductive layer 220 and a semiconductor layer 222 by performing dry etching on the conductive film 212 and the semiconductor film 210 with the use of the first mask layer 218; forming an insulating film 224 so as to cover at least the conductive layer 220 and the semiconductor layer 222; forming sidewall insulating layers 226 so as to cover at least the entire side surfaces of the semiconductor layer 222 by performing etch-back treatment on the insulating film 224; forming a second resist mask 230 over the first mask layer 218; forming a second mask layer 232 by performing dry etching or wet etching on the first mask layer 218 with the use of the second resist mask 230; removing the second resist mask 230; and forming source electrode and drain electrode layers 234 by performing dry etching on the conductive layer 220 with the use of the second mask layer 232. The method for manufacturing the transistor in this embodiment will be described with reference to FIGS. 5A to 5D, FIGS. 6A to 6D, and FIGS. 7A to 7D.

Figure 5A:
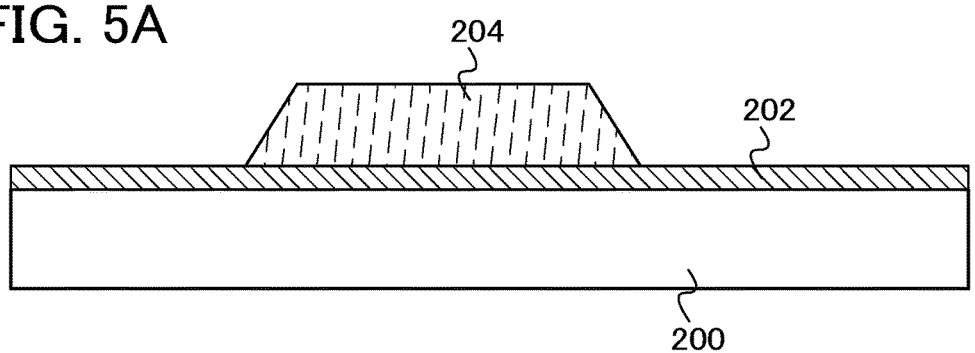
FIGS. 5A to 5D are cross-sectional views illustrating a method for manufacturing a semiconductor device according to one embodiment of the present invention.

First, a conductive film 202 is formed over a substrate 200, and then, a resist mask 204 is formed over the conductive film 202 (FIG. 5A).

The substrate 200 is an insulating substrate. As the substrate 200, for example, a glass substrate, a quartz substrate, a ceramic substrate, or a plastic substrate or the like with heat resistance that is high enough to withstand a process temperature in this manufacturing process can be used. When the substrate 200 is a glass substrate, the substrate may have any size of the first generation (e.g., 320 mm×400 mm) to the tenth generation (e.g., 2950 mm×3400 mm); however, the substrate is not limited thereto.

Note that a base insulating film may be formed over the substrate 200. As the base insulating film, a silicon nitride film may be formed, for example.

The conductive film 202 may be formed by a sputtering method, a CVD method (including a plasma CVD method, a thermal CVD method, and the like), or the like, for example. A metal film, a semiconductor film to which an impurity element imparting one conductivity type is added, or the like can be given as an example of a material of the conductive film 202. Alternatively, the conductive film 202 may be formed by an ink-jet method or the like. Note that the conductive film 202 may be formed to have either a single-layer structure or a stacked structure including a plurality of layers. For example, a three-layer structure may be employed in which an Al layer is sandwiched between Ti layers or Mo layers.

The resist mask 204 is formed in such a manner that a resist material is applied or the like over the conductive film 202 and then processed by a photolithography method.

Figure 5B:
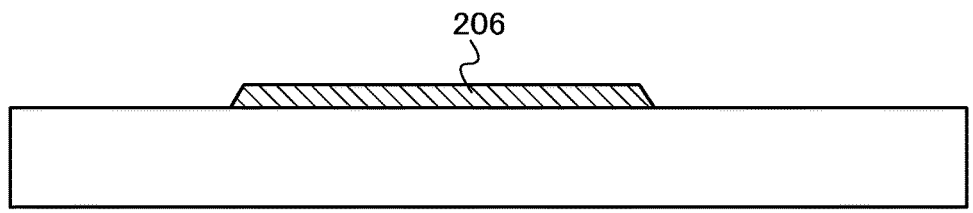

Next, the conductive film 202 is etched to form the gate electrode layer 206 (FIG. 5B).

Figure 5C:
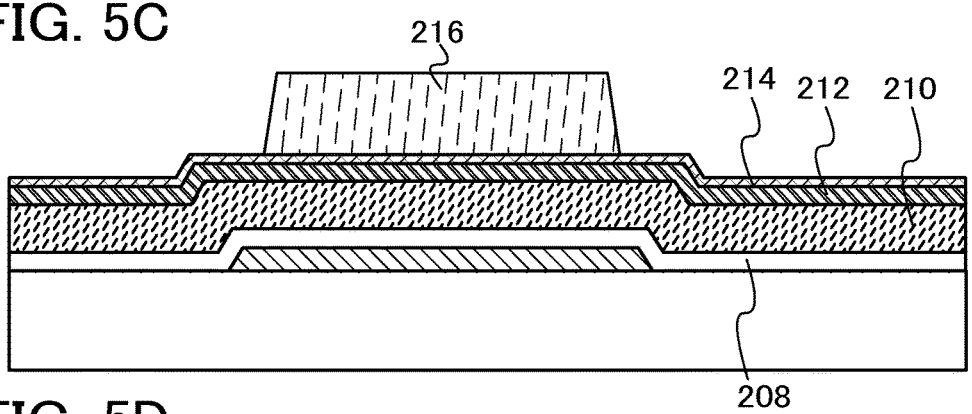

Next, the gate insulating layer 208 is formed so as to cover the gate electrode layer 206, the semiconductor film 210, the conductive film 212, and the mask film 214 are stacked in this order over the gate insulating layer 208, and the first resist mask 216 is formed over the mask film 214 (FIG. 5C).

The gate insulating layer 208 may be formed using an insulating material (e.g., silicon nitride, silicon nitride oxide, silicon oxynitride, or silicon oxide) film by a sputtering method, a CVD method (including a plasma CVD method, a thermal CVD method, and the like), or the like, for example. Note that the gate insulating layer 208 may be formed to have either a single-layer structure or a stacked structure including a plurality of layers.

Note that "silicon nitride oxide" contains more nitrogen than oxygen, and it is preferred that in the case where measurements are performed using Rutherford backscattering spectrometry (RBS) and hydrogen forward scattering (HFS), the compositions of oxygen, nitrogen, silicon, and hydrogen be estimated to range from 5 at. % to 30 at. %, 20 at. % to 55 at. %, 25 at. % to 35 at. %, and 10 at. % to 30 at. %, respectively.

"Silicon oxynitride" contains more oxygen than nitrogen, and it is preferred that in the case where measurements are performed using RBS and HFS, the compositions of oxygen, nitrogen, silicon, and hydrogen be estimated to range from 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total atomic composition in the silicon oxynitride or the silicon nitride oxide is defined as 100 at. %.

The semiconductor film 210 may be any semiconductor film having either a single-layer structure or a stacked structure including a plurality of layers. An oxide semiconductor film or a silicon film can be given as an example of the semiconductor film 210.

In the case where the semiconductor film 210 is an oxide semiconductor film, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; an In—O-based oxide semiconductor, a Sn—O-based oxide semiconductor, or a Zn—O-based oxide semiconductor, or the like can be used. The oxide semiconductor film may contain $SiO_2$. For example, an In—Ga—Zn—O-based oxide semiconductor film means an oxide semiconductor film containing In, Ga, or Zn, and there is no particular limitation on the stoichiometric proportion. Further, the In—Ga—Zn—O-based oxide semiconductor film may contain an element other than In, Ga, and Zn.

In the case where the semiconductor film 210 is an oxide semiconductor film, an oxide semiconductor represented by the chemical formula $InMO_3(ZnO)_m$ (m>0) can be used, for example. Here, M represents one or more metal elements selected from Ga, Al, Mn, and Co. For example, M can be Ga, Ga and Al, Ga and Mn, or Ga and Co. The oxide semiconductor film may contain $SiO_2$.

A target used for formation of the oxide semiconductor film by a sputtering method is, for example, an oxide target containing $In_2O_3$, $Ga_2O_3$, and ZnO at a composition ratio of 1:1:1 [molar ratio]. Without limitation to the material and the composition of the above target, an oxide target containing $In_2O_3$, $Ga_2O_3$, and ZnO at a composition ratio of 1:1:2 [molar ratio] may be used, for example.

Here, in the case where the semiconductor film 210 is an oxide semiconductor film formed by a sputtering method, the semiconductor film 210 can be formed by a sputtering method in a rare gas (e.g., Ar) atmosphere, an oxygen atmosphere, or a mixed atmosphere including a rare gas and oxygen.

The filling rate of the oxide target is higher than or equal to 90% and lower than or equal to 100%, preferably higher than or equal to 95% and lower than or equal to 99.9%. With the use of the oxide target having a high filling rate, the oxide semiconductor film to be formed can be a dense film.

In the case where the semiconductor film 210 is an oxide semiconductor film, the gate insulating layer 208 which is in contact with the semiconductor film 210 may be formed using silicon oxide, the sidewall insulating layers 226 to be formed later may be also formed using silicon oxide, and heat treatment may be performed under such a condition that the oxide semiconductor film can be dehydrated or dehydrogenated. Even in the case where heat treatment is performed in such a manner, the heat treatment can be performed in a shorter time as compared to a conventional heat treatment because the oxide semiconductor film is not exposed to moisture.

Alternatively, a silicon film may be used as the semiconductor film 210. As the silicon film, an amorphous silicon film may be used. Alternatively, a stacked silicon film in which a silicon film with low carrier mobility is formed over a silicon film with high carrier mobility may be used.

As the silicon film with high carrier mobility, a crystalline silicon film can be given. As the crystalline silicon, microcrystalline silicon can be given, for example. Here, microcrystalline silicon has an intermediate structure between an amorphous structure and a crystalline structure (including a single crystal structure and a polycrystalline structure). Microcrystalline silicon has a third state that is thermodynamically stable and has short-range order and lattice distortion, in which column-like or needle-like crystal grains having a diameter greater than or equal to 2 nm and less than or equal to 200 nm, preferably greater than or equal to 10 nm and less than or equal to 80 nm, more preferably greater than or equal to 20 nm and less than or equal to 50 nm grow in a direction normal to the substrate surface. Thus, there is a case where crystal grain boundaries are formed at the interface of the column-like or needle-like crystal grains. Note that the crystal grain size here means a maximum diameter of a crystal grain in a plane parallel to the substrate surface. Further, the crystal grain includes an amorphous silicon region and a crystallite which is a minute crystal that can be regarded as a single crystal. The crystal grain may include a twin crystal.

Microcrystalline silicon has a peak of Raman spectrum which is shifted to a lower wavenumber side than 520 cm$^{-1}$ that represents single crystal silicon. That is, the peak of the Raman spectrum of microcrystalline silicon is within the range from 520 cm$^{-1}$ which represents single crystal silicon, to 480 cm$^{-1}$ which represents amorphous silicon. Moreover, microcrystalline silicon contains a rare gas element such as He, Ar, Kr, or Ne to further promote lattice distortion, so that microcrystalline silicon with high stability can be obtained.

As the silicon film with low carrier mobility, an amorphous silicon film may be used. A silicon film including amorphous silicon and a minute silicon crystal grain, which has lower energy at the Urbach edge, which is measured by a constant photocurrent method (CPM) or photoluminescence spectrometry, and a smaller quantity of absorption spectra of defects, as compared to a conventional amorphous silicon film, is preferably used. As compared to the conventional amorphous silicon film, such a silicon film is a well-ordered silicon film which has few defects and a steep tail slope of a level at a band edge (a mobility edge) in the valence band.

The silicon film with low carrier mobility may contain halogen or nitrogen. In the case of containing nitrogen, nitrogen may exist as an NH group or an $NH_2$ group.

Note that here, an interface region between the silicon film with high carrier mobility and the silicon film with low carrier mobility includes microcrystalline semiconductor regions and amorphous semiconductor regions filling a space between the microcrystalline semiconductor regions. Specifically, the interface region between the silicon film with high carrier mobility and the silicon film with low carrier mobility includes a microcrystalline semiconductor region which extends in a conical or pyramidal shape from the silicon film with high carrier mobility and "a region including an amorphous semiconductor" which is similar to the silicon film with low carrier mobility.

When the silicon film with low carrier mobility is provided between the source and drain electrodes and the silicon film with high carrier mobility, off-state current of the transistor can be reduced. Further, since the interface region has the microcrystalline silicon region which extends in a conical or pyramidal shape, resistance in the vertical direction (the direction in which the film grows) can be lowered and on-state current of the transistor can be increased. In other words, as compared to the case of using conventional amorphous silicon, the off-state current can be sufficiently reduced and reduction in on-state current can be suppressed; thus, switching characteristics of the transistor can be improved.

Note that the microcrystalline silicon region grows from a surface of the silicon film with high carrier mobility in the film thickness direction. When the flow rate of hydrogen with respect to that of a deposition gas (e.g., silane) in a source gas is low (that is, the dilution ratio is low) or when the concentration of a source gas containing nitrogen is high, crystal growth in the microcrystalline silicon region is suppressed, and thus, crystal grains come to have a conical or pyramidal shape, and a large portion of the deposited silicon is amorphous.

The conductive film 212 may be formed by a sputtering method, a CVD method (including a plasma CVD method, a thermal CVD method, and the like), or the like, for example. Alternatively, the conductive film 212 may be formed by an ink-jet method. Note that the conductive film 212 may have a single-layer structure or a stacked structure including a plurality of layers. For example, a two-layer structure in which an Al film is formed over a Ti film may be employed.

The mask film 214 may be formed using a material which is not (is not easily) etched in a first etching process and a third etching process performed later. As the mask film 214, for example, an insulating film such as a silicon oxide film or a silicon nitride film can be used. Alternatively, as the mask film 214, a metal film can be used, for example. In the case where a metal film is used, the metal film can be used as part of an electrode layer.

The first resist mask 216 is formed in such a manner that a resist material is applied or the like over the mask film 214 and then processed by a photolithography method.

Figure 5D:
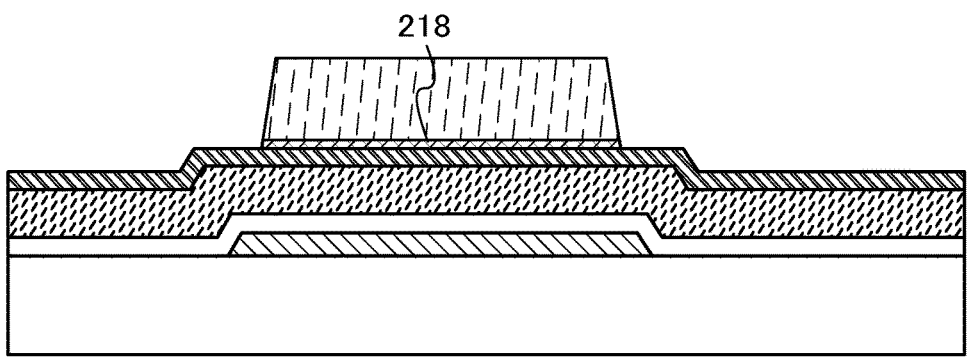

Next, the mask film 214 is subjected to dry etching or wet etching with the use of the first resist mask 216 to form the first mask layer 218 (FIG. 5D). In this embodiment, this process is referred to as the first etching process.

Here, the first etching process may be performed under such conditions that the etching rate of the conductive film 212 is low and the etching rate of the mask film 214 is high. In other words, the first etching process may be performed under such conditions that the etching selectivity of the mask film 214 with respect to the conductive film 212 is high.

Figure 6A:
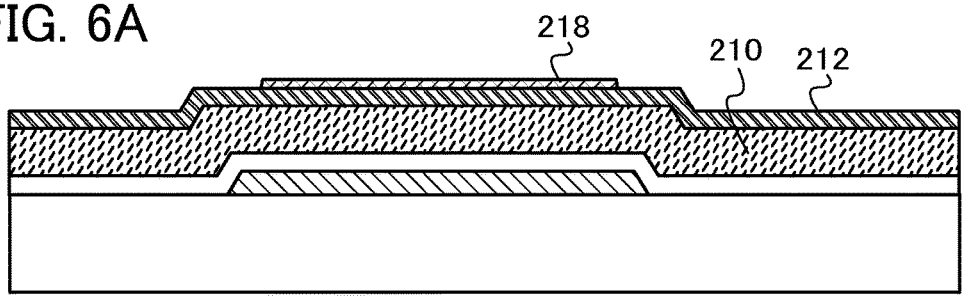
FIGS. 6A to 6D are cross-sectional views illustrating a method for manufacturing a semiconductor device according to one embodiment of the present invention.

Next, the first resist mask 216 is removed using a resist stripper (FIG. 6A).

Figure 6B:
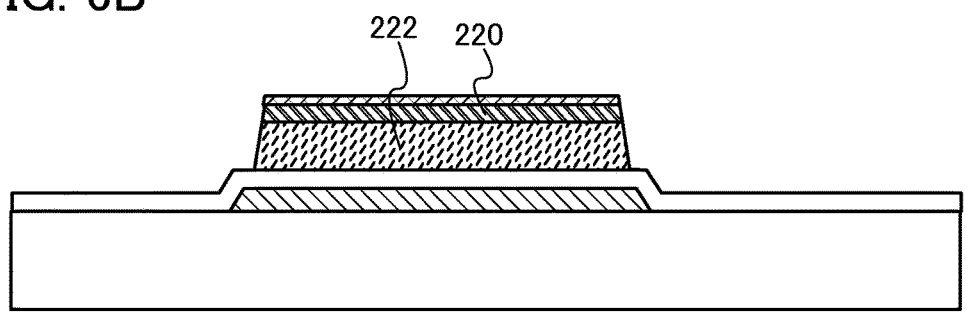

Next, the conductive film 212 and the semiconductor film 210 are subjected to dry etching with the use of the first mask layer 218 to form the conductive layer 220 and the semiconductor layer 222 (FIG. 6B). In this embodiment, this process is referred to as a second etching process.

Here, the second etching process may be performed under such conditions that the etching rate of the first mask layer 218 is low and the etching rates of the conductive film 212 and the semiconductor film 210 are high. In other words, the second etching process may be performed under such conditions that the etching selectivity of the conductive film 212 and the semiconductor film 210 with respect to the first mask layer 218 is high. Note that the second etching process preferably includes a plurality of steps (e.g., two steps) because plural kinds of films are etched.

Here, as in Embodiment 2, the first mask layer 218 may be removed. A method by which the semiconductor layer 222 is not exposed to moisture (e.g., dry etching treatment) is applied to the removal of the first mask layer 218.

Figure 6C:
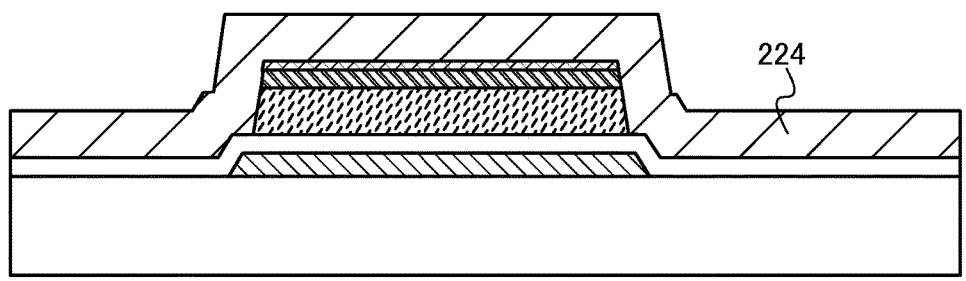

Next, the insulating film 224 which covers the conductive layer 220 and the semiconductor layer 222 is formed by a sputtering method, a CVD method (including a plasma CVD method, a thermal CVD method, and the like), or the like (FIG. 6C).

Figure 6D:
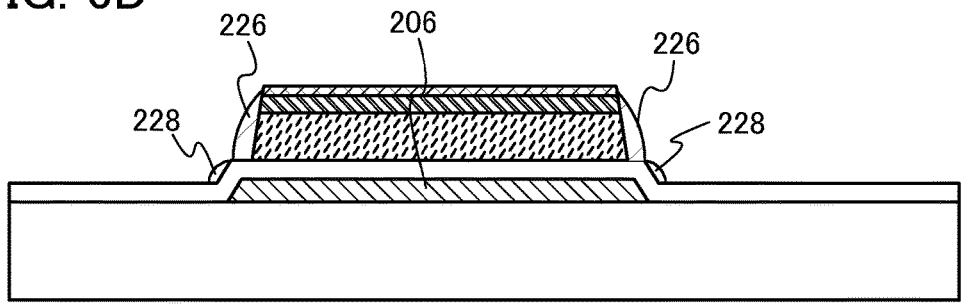

Next, the insulating film 224 is subjected to etch-back treatment to form the sidewall insulating layers 226 so as to cover at least the entire side surfaces of the semiconductor layer 222. Here, the etch-back treatment is performed until the first mask layer 218 or the conductive layer 220 is exposed. Note that at the same time as the formation of the sidewall insulating layers 226, sidewall insulating layers 228 are formed in exposed portions of step portions provided in the gate insulating layer 208 due to the thickness of the gate electrode layer 206 (FIG. 6D).

Figure 7A:
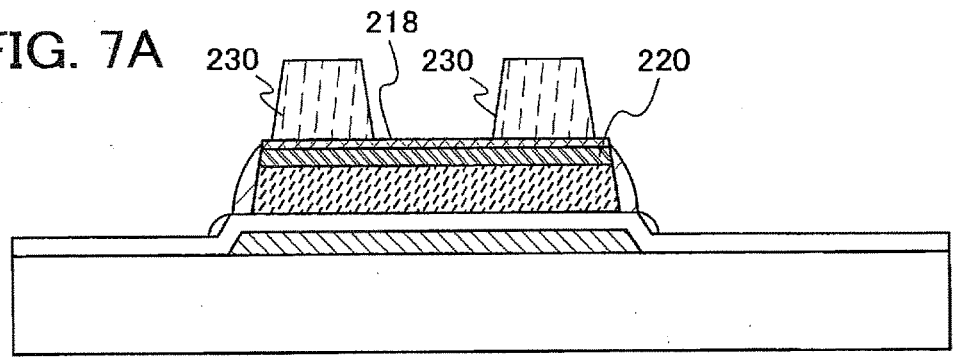
FIGS. 7A to 7D are cross-sectional views illustrating a method for manufacturing a semiconductor device according to one embodiment of the present invention.

Next, the second resist mask 230 is formed over the first mask layer 218 (FIG. 7A).

The second resist mask 230 is formed in such a manner that a resist material is applied or the like over the first mask layer 218 and then processed by a photolithography method.

Alternatively, in the case where the first mask layer 218 is removed through the steps up to here, a second mask film is formed over at least the conductive layer 220 and the second resist mask 230 is formed over the second mask film.

Figure 7B:
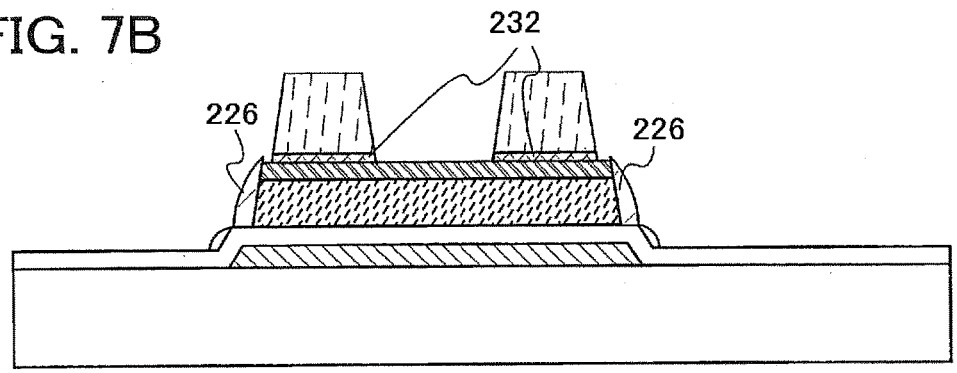

Next, the first mask layer 218 or the second mask film is subjected to dry etching or wet etching with the use of the second resist mask 230 to form the second mask layer 232. In this embodiment, this process is referred to as the third etching process (FIG. 7B).

Here, the third etching process may be performed under such conditions that the etching rate of the conductive film 212 is low and the etching rate of the mask film 214 is high. In other words, the third etching process may be performed under such conditions that the etching selectivity of the mask film 214 with respect to the conductive film 212 is high. Note that it is also important that the sidewall insulating layers 226 are not etched.

Figure 7C:
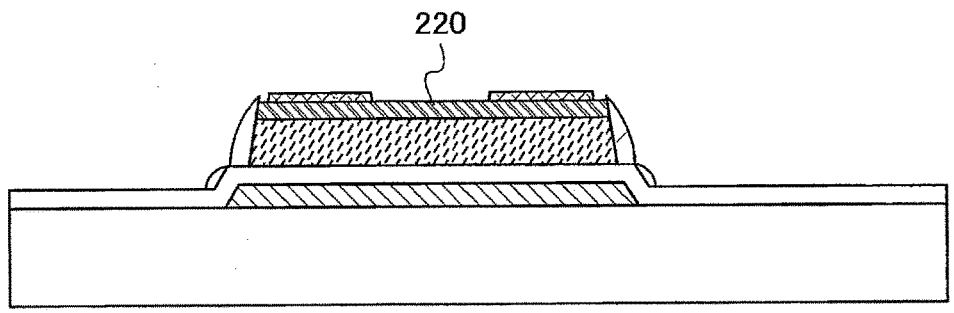

Next, the second resist mask 230 is removed using a resist stripper (FIG. 7C).

Figure 7D:
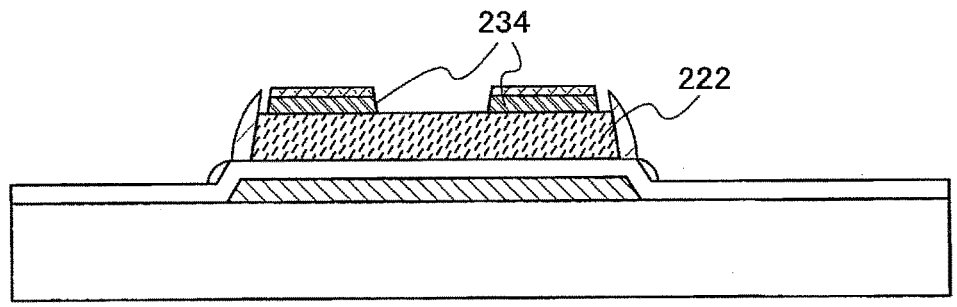

Next, the conductive layer 220 is subjected to dry etching with the use of the second mask layer 232 to form the source electrode and drain electrode layers 234. In this embodiment, this process is referred to as a fourth etching process (FIG. 7D). In this embodiment, the fourth etching process results in the formation of a space (a groove) between the source electrode and drain electrode layers 234 and the sidewall insulating layers 226, which allows them to be separated and spaced from each other. In other words, the source electrode and drain electrode layers 234 and the sidewall insulating layers 226 are not in contact with each other.

Here, the fourth etching process may be performed under such conditions that the etching rate of the semiconductor layer 222 is low and the etching rate of the conductive layer 220 is high. In other words, the fourth etching process may be performed under such conditions that the etching selectivity of the conductive layer 220 with respect to the semiconductor layer 222 is high.

Although not illustrated, part of the semiconductor layer 222, which does not overlap with the second mask layer 232, may be etched in the fourth etching process.

Although not illustrated, the second mask layer 232 may be removed after that. A means by which the semiconductor layer 222 is not exposed to moisture (e.g., dry etching treatment) is applied to the removal of the second mask layer 232.

In the method for manufacturing a semiconductor device described above, a combination of a material of a thin film and a gas or an etchant used in an etching process should be considered.

For example, in the case where the semiconductor film 210 is an In—Ga—Zn—O-based oxide semiconductor film, the conductive film 212 is a titanium film, and the mask film 214 is an aluminum oxide film, a chemical solution in which phosphoric acid, acetic acid, nitric acid, and pure water are mixed (at the volume ratio of 85:5:5:5, for example) may be used as an etchant in the first etching process and the third etching process; a Cl-based gas may be used in the second etching process; and an F-based gas may be used in the fourth etching process. Alternatively, the fourth etching process may be performed by two steps of etching using a Cl-based gas and etching using an F-based gas.

Alternatively, in the case where the semiconductor film 210 is an In—Ga—Zn—O-based oxide semiconductor film, the conductive film 212 is a titanium film, and the mask film 214 is a silicon oxide film, hydrofluoric acid may be used as an etchant in the first etching process and the third etching process. In this case, a Cl-based gas may be used in the second etching process, and an F-based gas may be used in the fourth etching process. Alternatively, the fourth etching process may be performed by two steps of etching using a Cl-based gas and etching using an F-based gas.

Note that as an example of the Cl-based gas, a $CCl_4$ gas, a $SiCl_4$ gas, a $BCl_3$ gas, or a $Cl_2$ gas can be given. Specifically, a mixed gas of a $BCl_3$ gas and a $Cl_2$ gas is preferably used.

Note that as an example of the F-based gas, a $CF_4$ gas, a $SF_6$ gas, a $NF_3$ gas, a $CBrF_3$ gas, a $CF_3SO_3H$ gas, or a $C_3F_8$ gas can be given. Specifically, a $SF_6$ gas is preferably used.

As described in this embodiment, the semiconductor element (e.g., a transistor) can be manufactured without exposing a surface of the semiconductor layer 222 to moisture or the like at all.

Note that the method for manufacturing a thin film element described in Embodiment 2 may be applied to the method for manufacturing a semiconductor element described in this embodiment. In other words, the first mask layer 218 may be removed before formation of the insulating film 224, or the first mask layer 218 may be removed at the time of formation of the sidewall insulating layers 226.

Note that the method for manufacturing a thin film element described in Embodiment 3 may be applied to the method for manufacturing a semiconductor element described in this embodiment. In other words, the sidewall insulating layers may have a stacked structure. In this case, as the inside sidewall insulating layers which are in contact with the side surfaces of the semiconductor layer, a silicon oxide layer, a silicon oxynitride layer, a silicon nitride oxide layer, or a silicon nitride layer may be formed by a sputtering method or a CVD method (including a plasma CVD method, a thermal CVD method, and the like), and as the outside sidewall insulating layers, a silicon oxide layer, a silicon oxynitride layer, a silicon nitride oxide layer, or a silicon nitride layer may be formed by a sputtering method or a CVD method (including a plasma CVD method, a thermal CVD method, and the like), for example. It is preferable that a silicon oxide layer be formed by a sputtering method as the inside sidewall insulating layers and a silicon nitride layer be formed by a plasma CVD method as the outside sidewall insulating layers, for example, because hydrogen contained in the semiconductor layer can be reduced and sidewall insulating layers having high barrier properties, which prevents hydrogen and moisture from entering the semiconductor layer, can be formed. Further, in the case where the semiconductor layer 222 is an oxide semiconductor layer, a portion which is in contact with the oxide semiconductor layer is formed using a silicon oxide layer, so that oxygen can be supplied to the oxide semiconductor layer.

Embodiment 5

The semiconductor element (transistor) described in Embodiment 4 can be used as a pixel transistor of a display device.

A method for manufacturing a pixel transistor in this embodiment includes the steps of: forming a protective insulating film 236 so as to cover at least the source electrode and drain electrode layers 234 and the semiconductor layer 222 of the transistor, which are formed by the method described in Embodiment 4; forming an opening portion 240 so as to expose the source electrode or drain electrode layer 234 in a portion of the protective insulating film 236, which overlaps with the source electrode or drain electrode layer 234; and regioselectively forming a pixel electrode layer 246 over the protective insulating film 236 so as to be connected to the source electrode or drain electrode layer 234 through the opening portion 240. The method for manufacturing a thin film element of this embodiment will be described with reference to FIGS. 8A to 8D.

Figure 8A:
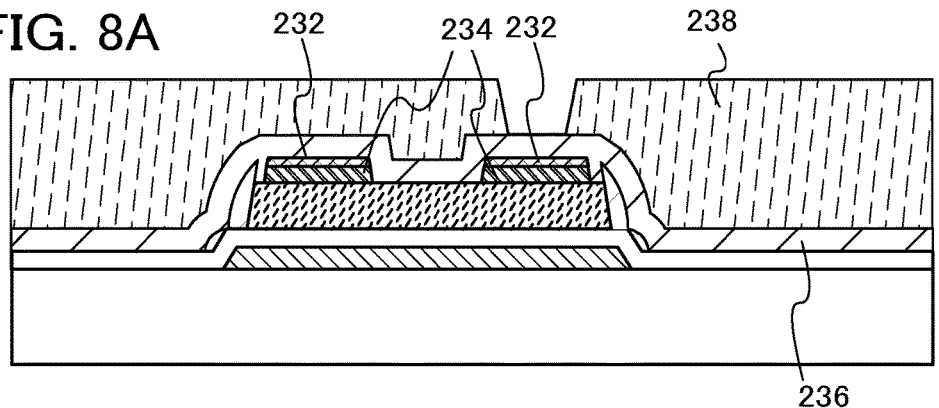
FIGS. 8A to 8D are cross-sectional views illustrating a method for manufacturing a semiconductor device according to one embodiment of the present invention.

First, the protective insulating film 236 is formed so as to cover at least the second mask layer 232, the source electrode and drain electrode layers 234, and the semiconductor layer 222 of the transistor manufactured by the method described in Embodiment 4 (FIG. 8A).

The protective insulating film 236 may be formed using an insulating material as in the case of the gate insulating layer 208. Note that the protective insulating film 236 may have a single-layer structure or a stacked structure including a plurality of layers. Here, the protective insulating film 236 may be formed using silicon nitride, for example.

Figure 8B:
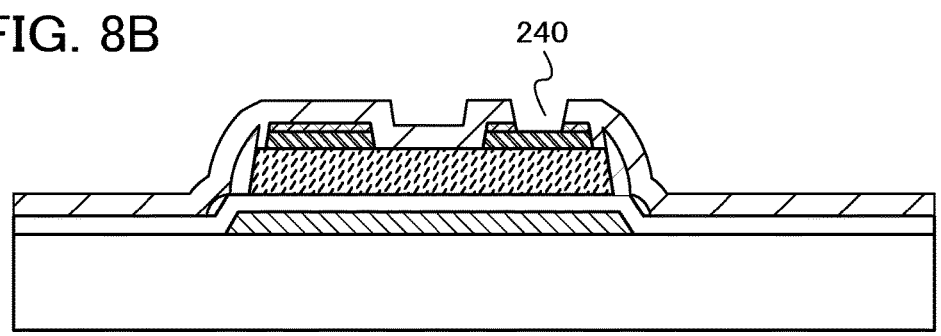

Next, a resist mask 238 is formed over the protective insulating film 236, and the opening portion 240 is formed in the portion of the protective insulating film 236, which overlaps with the source electrode or drain electrode layer 234 (FIG. 8B).

Figure 8C:
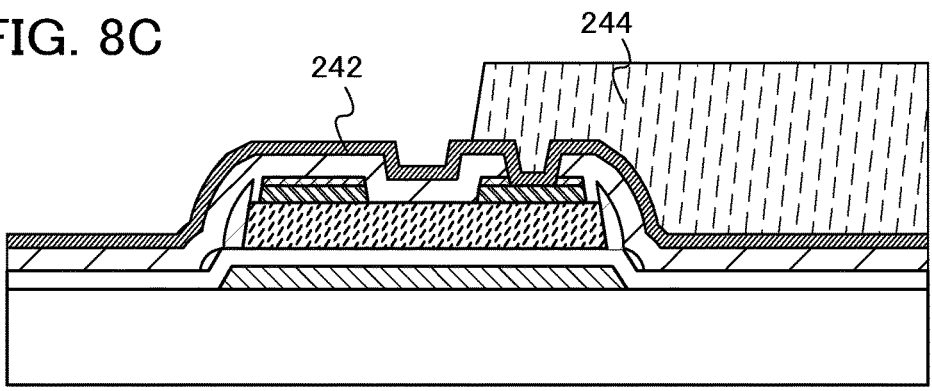
Figure 8D:
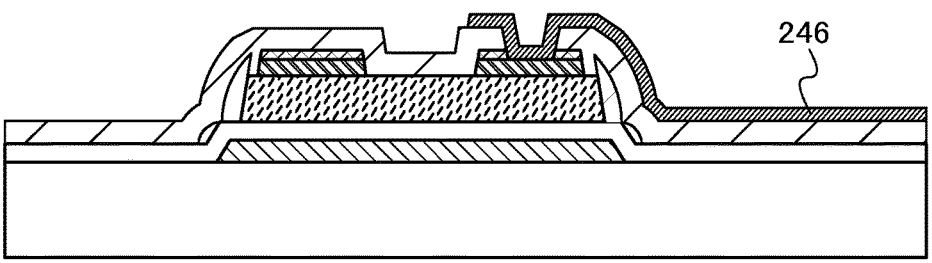

Next, the pixel electrode layer 246 is regioselectively formed over the protective insulating film 236 so as to be connected to the source electrode or drain electrode layer 234 through the opening portion 240. In this embodiment, as an example, a transparent conductive film 242 is formed over the protective insulating film 236, and a resist mask 244 is formed over the transparent conductive film 242 (FIG. 8C). Then, the transparent conductive film 242 is etched to form the pixel electrode layer 246 (FIG. 8D).

Without limitation thereto, the pixel electrode layer 246 may be regioselectively formed over the protective insulating film 236 by an ink-jet method so as to be connected to the source electrode or drain electrode layer 234 through the opening portion 240.

The transparent conductive film 242 can be formed using a conductive composition including a conductive high molecule (also referred to as a conductive polymer) having a light-transmitting property. It is preferable that the transparent conductive film 242 formed using the conductive composition have a sheet resistance of less than or equal to 10000 Ω/square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The transparent conductive film 242 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Figure 9:
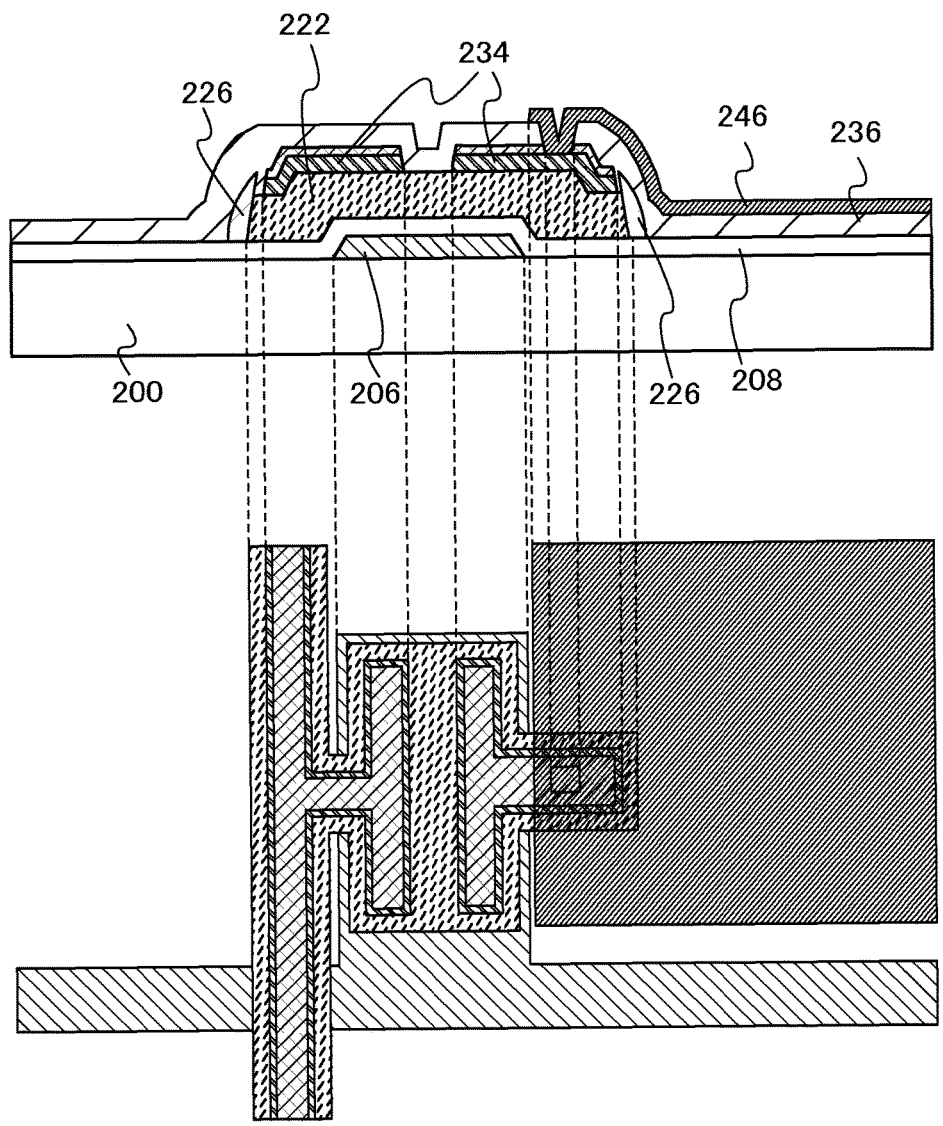
FIG. 9 illustrates a cross-sectional view and a top view for explaining a method for manufacturing a semiconductor device according to one embodiment of the present invention.

FIG. 9 illustrates an example of a cross-sectional view and a top view of the pixel transistor in which layers up to and including the pixel electrode layer 246 are formed as described above.

As described in this embodiment, the pixel transistor can be manufactured without exposing the surface of the semiconductor layer 222 to moisture or the like at all.

Embodiment 6

Electronic paper can be given as a semiconductor device which is one embodiment of the present invention. Electronic paper can be used for electronic appliances of a variety of fields as long as they can display data. For example, electronic paper can be applied to an electronic book reader (e-book reader), a poster, a digital signage, a public information display (PID), an advertisement in a vehicle such as a train, displays of various cards such as a credit card, and the like. An example of the electronic appliances is illustrated in FIG. 10.

Figure 10:
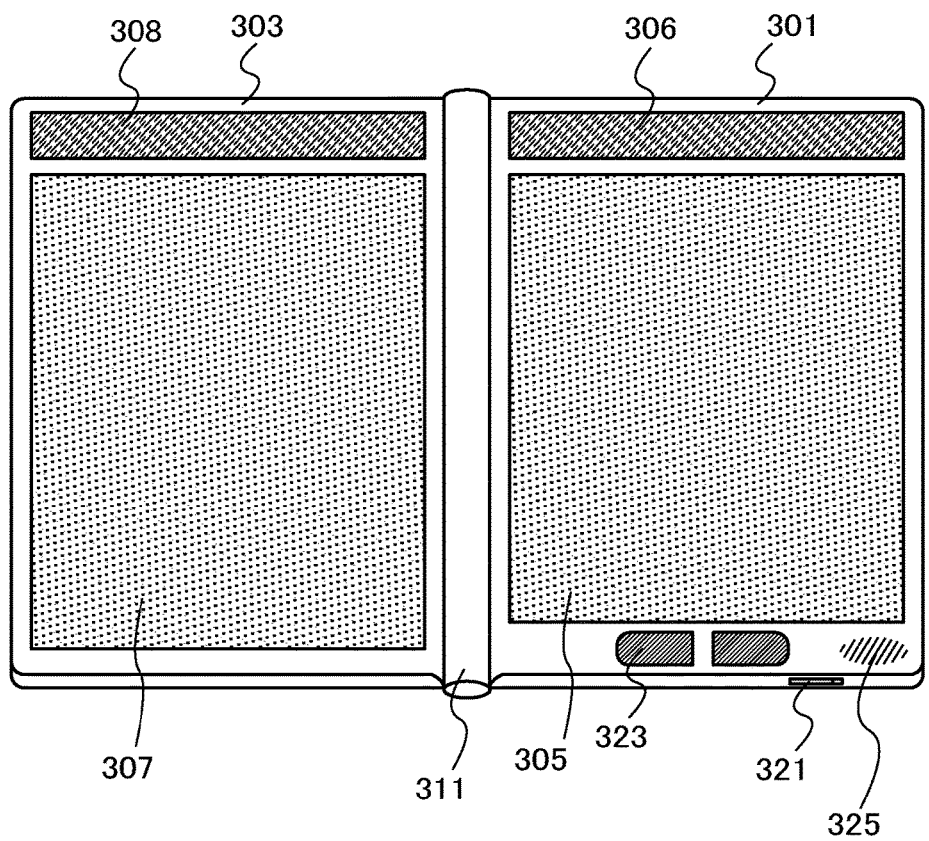
FIG. 10 illustrates a semiconductor device according to one embodiment of the present invention.

FIG. 10 illustrates an example of an e-book reader. For example, an e-book reader 300 includes two housings, a housing 301 and a housing 303. The housing 301 and the housing 303 are combined with a hinge 311 so that the e-book reader 300 can be opened and closed with the hinge 311 as an axis. With such a structure, the e-book reader 300 can be handled like a paper book.

A display portion 305 and a photoelectric conversion device 306 are incorporated in the housing 301. A display portion 307 and a photoelectric conversion device 308 are incorporated in the housing 303. The display portions 305 and 307 may display one image or different images. In the case where the display portions 305 and 307 display different images, for example, a display portion on the right (the display portion 305 in FIG. 10) can display text and a display portion on the left (the display portion 307 in FIG. 10) can display graphics.

Further, in FIG. 10, the housing 301 is provided with an operation portion and the like. For example, the housing 301 is provided with a power switch 321, operation keys 323, a speaker 325, and the like. Pages can be turned with the operation key 323. Note that a keyboard, a pointing device, or the like may also be provided on the surface of the housing, on which the display portion is provided. Further, an external connection terminal (an earphone terminal, a USB terminal, a terminal that can be connected to an AC adapter, various cables such as a USB cable, or the like), a recording medium insertion portion, and the like may be provided on the back surface or the side surface of the housing. Moreover, the e-book reader 300 may have a function of an electronic dictionary.

The e-book reader 300 may be configured to transmit and receive data wirelessly. Through wireless communication, desired book data or the like can be purchased and downloaded from an electronic book server.

The thin film element described in any of Embodiments 1 to 3, the transistor described in Embodiment 4, or the pixel transistor described in Embodiment 5 is employed, whereby the semiconductor device of this embodiment can be manufactured without exposing a desired layer to moisture.

Embodiment 7

As a semiconductor device which is one embodiment of the present invention, a variety of electronic appliances (including an amusement machine) can be given in addition to electronic paper. Examples of electronic appliances are a television set (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio reproducing device, a large-sized game machine such as a pachinko machine, and the like.

Figure 11A:
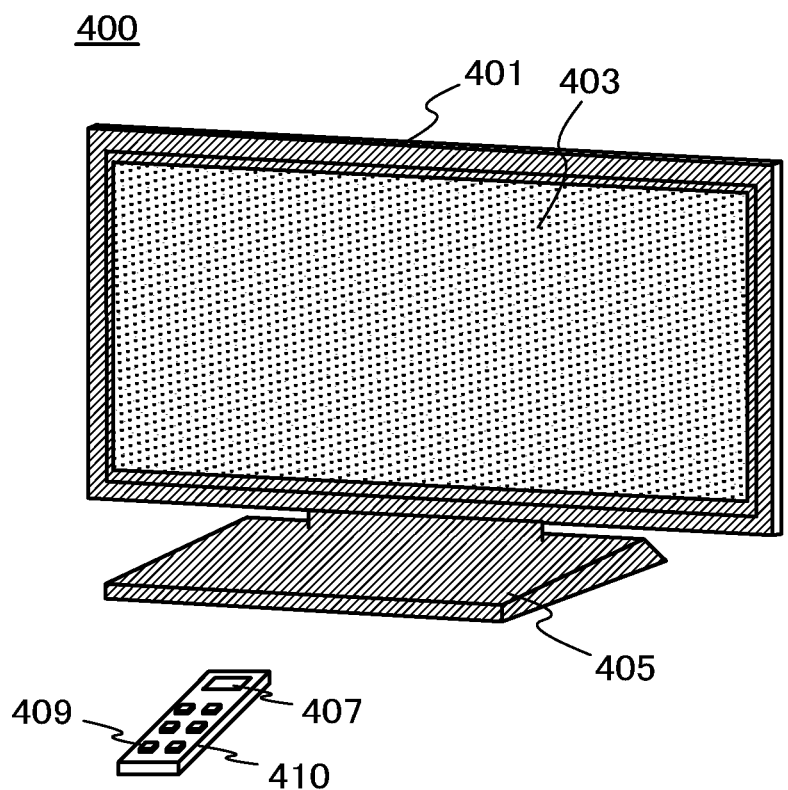
FIGS. 11A and 11B each illustrate a semiconductor device according to one embodiment of the present invention.

FIG. 11A illustrates an example of a television set. A display portion 403 is incorporated in a housing 401 of a television set 400. Images can be displayed on the display portion 403. Here, the housing 401 is supported by a stand 405.

The television set 400 can be operated by an operation switch of the housing 401 or a separate remote controller 410. Channels can be switched and volume can be controlled with operation keys 409 of the remote controller 410, whereby an image displayed on the display portion 403 can be controlled. Moreover, the remote controller 410 may have a display portion 407 in which the information output from the remote controller 410 is displayed.

Note that the television set 400 is provided with a receiver, a modem, and the like. With the use of the receiver, a general television broadcast can be received. Moreover, when the television set 400 is connected to a communication network with or without wires via the modem, one-way (from a sender to a receiver) or two-way (between a sender and a receiver or between receivers) information communication can be performed.

Figure 11B:
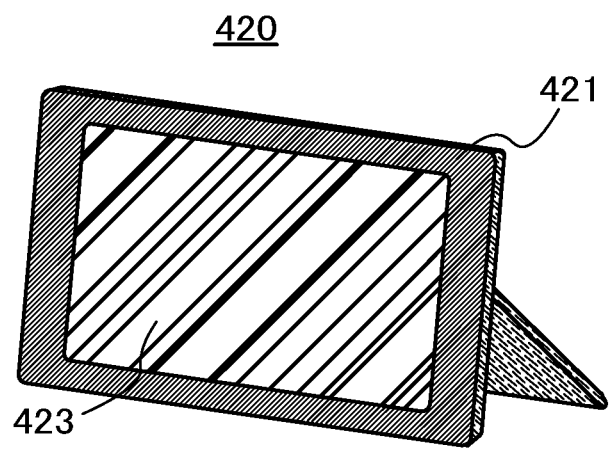

FIG. 11B illustrates an example of a digital photo frame. For example, a display portion 423 is incorporated in a housing 421 of a digital photo frame 420. The display portion 423 can display various images. For example, the display portion 423 can display data of an image shot by a digital camera or the like to function as a normal photo frame.

Note that the digital photo frame 420 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 420. For example, a memory storing data of an image shot by a digital camera is inserted in the recording medium insertion portion of the digital photo frame and the image data is loaded, whereby the image data can be displayed on the display portion 423.

The digital photo frame 420 may be configured to transmit and receive data wirelessly. The structure may be employed in which desired image data is transferred wirelessly to be displayed.

Figure 12:
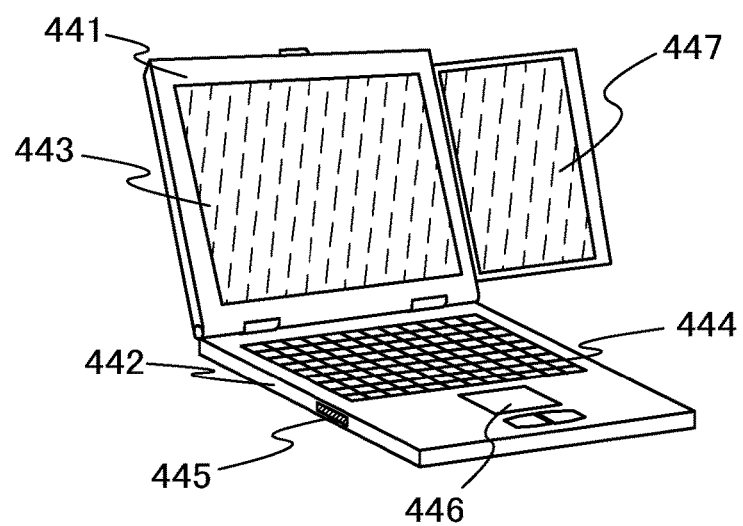
FIG. 12 illustrates a semiconductor device according to one embodiment of the present invention.

FIG. 12 is a perspective view illustrating an example of a portable computer.

In the portable computer of FIG. 12, a top housing 441 having a display portion 443 and a bottom housing 442 having a keyboard 444 can overlap with each other by closing a hinge unit which connects the top housing 441 and the bottom housing 442. Thus, the portable computer is convenient for carrying around. Moreover, in the case of using the keyboard for input, the hinge unit is opened so that a user can input looking at the display portion 443.

The bottom housing 442 includes a pointing device 446 with which input can be performed, in addition to the keyboard 444. Further, when the display portion 443 is a touch input panel, input can be performed by touching part of the display portion. The bottom housing 442 includes an arithmetic function portion such as a CPU or hard disk. In addition, the bottom housing 442 includes an external connection port 445 into which another device such as a communication cable conformable to communication standards of a USB is inserted.

The top housing 441 further includes a display portion 447 which can be stored in the top housing 441 by sliding it toward the inside of the top housing 441. With the display portion 447, a large display screen can be realized. In addition, the user can adjust the orientation of a screen of the storable display portion 447. When the storable display portion 447 is a touch input panel, input can be performed by touching part of the storable display portion.

The display portion 443 or the storable display portion 447 is formed using an image display device such as a liquid crystal display panel or a light-emitting display panel including an organic light-emitting element, an inorganic light-emitting element, or the like.

In addition, the portable computer illustrated in FIG. 12 can be provided with a receiver and the like and can receive a television broadcast to display an image on the display portion. While the hinge unit which connects the top housing 441 and the bottom housing 442 is kept closed, the whole screen of the display portion 447 is exposed by sliding the display portion 447 out and the angle of the screen is adjusted; thus, the user can watch a television broadcast. In this case, the hinge unit is not opened and display is not performed on the display portion 443. In addition, start up of only a circuit for displaying a television broadcast is performed. Therefore, power can be consumed to the minimum, which is advantageous for the portable computer whose battery capacity is limited.

The thin film element described in any of Embodiments 1 to 3, the transistor described in Embodiment 4, or the pixel transistor described in Embodiment 5 is employed, whereby the semiconductor device of this embodiment can be manufactured without exposing a desired layer to moisture.

This application is based on Japanese Patent Application serial no. 2010-227623 filed with Japan Patent Office on Oct. 7, 2010, the entire contents of which are hereby incorporated by reference.

What is claimed is:

1. A semiconductor device comprising:
    a gate electrode over a substrate;
    a gate insulating layer over the gate electrode;
    a semiconductor layer over the gate insulating layer; and
    source electrode and drain electrode layers over the semiconductor layer,
    wherein a side surface of an edge portion of the semiconductor layer is covered with a sidewall comprising an insulating material.

2. The semiconductor device according to claim 1, wherein the semiconductor layer comprises an oxide of a metal selected from In, Ga, and Zn.

3. The semiconductor device according to claim 1, wherein the side surface of the semiconductor layer is entirely covered with the sidewall.

4. The semiconductor device according to claim 1, further comprising a second sidewall which covers the sidewall.

5. The semiconductor device according to claim 1, further comprising a second sidewall under the sidewall,
    wherein the second sidewall covers a side surface of a step of the gate insulating layer, and
    wherein the step of the gate insulating layer originates from a thickness of the gate electrode.

6. The semiconductor device according to claim 1, wherein the sidewall and the source electrode and drain electrode layers are spaced from each other by a groove located therebetween.

7. The semiconductor device according to claim 1, further comprising:
    an insulating layer over the source electrode and drain electrode layers; and
    a pixel electrode over the insulating layer, the pixel electrode being electrically connected to one of the source electrode and drain electrode layers.

8. A semiconductor device comprising:
    a first conductive layer over a substrate;
    an insulating layer over the first conductive layer;
    a semiconductor layer over the insulating layer; and
    a second conductive layer and a third conductive layer over the semiconductor layer,
    wherein a side surface of an edge portion of the semiconductor layer is covered with a sidewall comprising an insulating material.

9. The semiconductor device according to claim 8, wherein the semiconductor layer comprises an oxide of a metal selected from In, Ga, and Zn.

10. The semiconductor device according to claim 8, wherein the side surface of the semiconductor layer is entirely covered with the sidewall.

11. The semiconductor device according to claim 8, further comprising a second sidewall which covers the sidewall.

12. The semiconductor device according to claim 8, further comprising a second sidewall under the sidewall,
    wherein the second sidewall covers a side surface of a step of the insulating layer, and
    wherein the step of the insulating layer originates from a thickness of the first conductive layer.

13. The semiconductor device according to claim 8, wherein the sidewall and each of the second conductive layer and the third conductive layer is spaced from each other by a groove located therebetween.

14. The semiconductor device according to claim 8, further comprising:
    a second insulating layer over the second conductive layer and the third conductive layer; and
    a fourth conductive layer over the second insulating layer, the fourth conductive layer being electrically connected to one of the second conductive layer and the third conductive layer.

* * * * *